United States Patent
Kang et al.

(10) Patent No.: US 10,962,423 B2
(45) Date of Patent: Mar. 30, 2021

(54) METHOD FOR DETECTING INTERLOCK FAILURE OF CONNECTOR IN ECO-FRIENDLY VEHICLE

(71) Applicants: Hyundai Motor Company, Seoul (KR); Kia Motors Corporation, Seoul (KR)

(72) Inventors: Gun Soo Kang, Gyeonggi-Do (KR); Ki Jong Lee, Gyeonggi-Do (KR); Kang Ho Jeong, Changwon-Gyeongsangnam-Do (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 91 days.

(21) Appl. No.: 14/858,071

(22) Filed: Sep. 18, 2015

(65) Prior Publication Data

US 2016/0124046 A1 May 5, 2016

(30) Foreign Application Priority Data

Nov. 4, 2014 (KR) .................. 10-2014-0152065

(51) Int. Cl.
*G01K 7/22* (2006.01)
*G01R 31/42* (2006.01)
*B60L 3/00* (2019.01)
*G01R 31/327* (2006.01)
*G01R 31/00* (2006.01)

(52) U.S. Cl.
CPC .............. *G01K 7/22* (2013.01); *B60L 3/0023* (2013.01); *G01R 31/42* (2013.01); *G01R 31/006* (2013.01); *G01R 31/3277* (2013.01)

(58) Field of Classification Search
CPC .......... G01K 7/22; G01R 31/42; G01R 31/04; G01R 31/2818; B60L 3/003; B60L 3/0023
USPC ........................... 324/538, 415–424
See application file for complete search history.

(56) References Cited

U.S. PATENT DOCUMENTS

| | | | |
|---|---|---|---|
| 2010/0156435 A1* | 6/2010 | Kangas | G05B 9/02 324/538 |
| 2010/0169674 A1* | 7/2010 | Kazama | G06F 1/28 713/300 |
| 2012/0091954 A1* | 4/2012 | Matsuki | B60L 3/0023 320/109 |

(Continued)

FOREIGN PATENT DOCUMENTS

| CN | 103368338 A | 10/2013 |
|---|---|---|
| JP | 1997-172781 | 6/1997 |

(Continued)

*Primary Examiner* — Jeff W Natalini
(74) *Attorney, Agent, or Firm* — Mintz Levin Cohn Ferris Glovsky and Popeo, P.C.; Peter F. Corless

(57) ABSTRACT

A method includes: detecting, by a motor controller, an interlock failure of a connector for connecting between a gate driver and the motor controller, the connector being connected to an inverter for driving a motor in an eco-friendly vehicle; and determining, by the motor controller, that the interlock failure of the connector has occurred when an output value of a signal processor provided in the motor controller so that a sensing signal is inputted from the gate driver through the connector is detected as a value beyond a predetermined normal sensing range.

6 Claims, 4 Drawing Sheets

(56) References Cited

U.S. PATENT DOCUMENTS

| | | | | |
|---|---|---|---|---|
| 2012/0249069 A1* | 10/2012 | Ohtomo | ............... | B60L 1/08 |
| | | | | 320/109 |
| 2013/0027978 A1* | 1/2013 | Suzuki | ............. | H02M 3/33507 |
| | | | | 363/15 |
| 2014/0167669 A1* | 6/2014 | Lim | ................. | G01R 35/005 |
| | | | | 318/490 |
| 2015/0069933 A1* | 3/2015 | Ragogna | ............ | D06F 58/206 |
| | | | | 318/105 |

FOREIGN PATENT DOCUMENTS

| | | |
|---|---|---|
| JP | H09172781 A | 6/1997 |
| KR | 10-1999-0071311 | 9/1999 |
| KR | 10-2003-0005939 | 1/2003 |
| KR | 10-2008-0039163 | 5/2008 |
| KR | 10-2012-0074917 | 6/2014 |
| KR | 10-2014-0096866 | 8/2014 |

* cited by examiner

| Temperature | Temperature sensor | Voltage |
|---|---|---|
| OPEN | OPEN | 5.000 |
| -30 | | 4.856 |
| -20 | | 4.754 |
| -10 | | 4.602 |
| 0 | | 4.388 |
| 10 | | 4.107 |
| 20 | | 3.763 |
| 30 | | 3.370 |
| 40 | | 2.951 |
| 50 | | 2.532 |
| 60 | | 2.135 |
| 70 | | 1.779 |
| 80 | | 1.469 |
| 90 | | 1.208 |
| 100 | | 0.990 |
| 110 | | 0.812 |
| 120 | | 0.669 |
| 130 | | 0.554 |
| 140 | | 0.461 |
| 150 | | 0.385 |
| 160 | | 0.323 |
| 170 | | 0.274 |
| 180 | | 0.231 |

FIG. 5

METHOD FOR DETECTING INTERLOCK FAILURE OF CONNECTOR IN ECO-FRIENDLY VEHICLE

CROSS-REFERENCE TO RELATED APPLICATION

This application claims under 35 U.S.C. § 119(a) priority to and the benefit of Korean Patent Application No. 10-2014-0152065 filed Nov. 4, 2014, the entire contents of which are incorporated herein by reference.

BACKGROUND

(a) Technical Field

The present disclosure relates generally to a method for detecting an interlock failure of a connector between a gate driver and a motor controller. More particularly, it relates to a method for detecting an interlock failure of a connector between a gate driver and a motor controller connected to an inverter for driving a motor in an eco-friendly vehicle.

(b) Background Art

In general, eco-friendly vehicles such as electric vehicles, hybrid electric vehicles or fuel cell electric vehicles contain a motor for driving the vehicle and an inverter for driving the motor by converting a DC voltage from a high-voltage power source (e.g., a high-voltage battery or fuel cell) into an AC voltage. The motor is driven by three-phase current transmitted from the inverter for converting the DC voltage into the AC voltage through a power cable. The inverter is a power conversion device that converts the DC voltage from the high-voltage power source into AC voltage as switching elements of a power module are switched according to a pulse width modulation (PWM) signal of a motor controller.

Insulated gate bipolar transistors (IGBTs) capable of performing a high-speed switching operation even with high power are mainly used as switching elements constituting a power module in a typical inverter. In addition, metal oxide silicon field effect transistors (MOSFETs) or similar components are used as the switching elements.

FIG. 1 is a configuration diagram illustrating a power system of an eco-friendly vehicle, which includes a high-voltage power source 1, a motor M, an inverter 11, a gate driver 12 and a motor controller 13. One or a plurality of motors may constitute the motor M. As shown in this figure, the gate driver 12 is connected to a power module (e.g., IGBT or MOSFET) in the inverter 11. In this state, the gate driver 12 applies a gate driving signal to each switching elements S in the power module according to a PWM signal applied from the motor controller 13.

Typically, the gate driver 12 is configured separately from the motor controller 13. In this state, the motor controller 13 is connected to the gate driver 12 by the connector to transmit a switching drive signal for driving the inverter 11, i.e., the PWM signal to the gate driver 12 through the connector and to receive various trouble information and sensing information inputted through gate driver 12.

FIG. 2 is a diagram illustrating a connection between the gate driver and the motor controller. In a state in which the gate driver 12 and the motor controller 13 are connected by the connector, the motor controller 13 applies power and a PWM signal to the gate driver 12, and receives an arm short signal, a temperature sensing signal, a voltage sensing signal, other sensing signals, and an interlock signal inputted through the gate driver 12. The arm short signal is a trouble information signal and is used as a signal for detecting a trouble.

The temperature sensing signal is a signal for monitoring a junction temperature of the power module in the inverter 11. Since damage of the switching element, the power module, or the inverter may occur due to the generation of heat in operation of the switching element S, the motor controller 13 always monitors the temperature of the inverter 13 through the temperature sensing signal transmitted from the gate driver 12. The interlock signal is used as a signal for detecting interlock and an interlock failure of the connector between the gate driver 12 and the motor controller 13. The interlock and the interlock failure of the connector are identified from a voltage signal inputted through an interlock circuit.

FIG. 3 is a circuit diagram illustrating an example of the interlock circuit, and an interlock circuit as shown in FIG. 3 is configured in the connector between the gate driver and the motor controller. The interlock circuit includes a lock-out terminal pin LOCK_OUT, a lock-in terminal pin LOCK_IN, a pull-up resistor R1 of a power input terminal VCC, and the like. If the lock-out terminal pin and the lock-in terminal pin are normally connected by normal interlock of the connector, a voltage divided by the pull-up resistor R1 of the power input terminal VCC is inputted, and thus the normal interlock of the connector can be detected by identifying the input voltage. If at least one of two terminals of the connector is not normally connected, i.e., in an open state, the interlock failure of the connector can be detected by identifying a power voltage (i.e., VCC voltage) applied through the pull-up resistor R1. In the interlock circuit, the pull-up resistor R1 may be replaced with a pull-down resistor.

As described above, conventionally, the interlock failure of the connector between the gate driver and the motor controller has been detected through a separate interlock circuit, and the interlock failure of the connector has been distinguished from trouble in each mode through the interlock circuit. However, the separate interlock circuit is provided, and therefore, the number of pins of the connector increases. As the interlock circuit is configured, the size and cost of the connector increase.

SUMMARY OF THE DISCLOSURE

The present disclosure provides a method for detecting an interlock failure of a connector in an eco-friendly vehicle, in which interlock and an interlock failure of the connector are identified using the existing input signal inputted to a motor controller from a gate driver for driving an inverter, so that the existing interlock circuit can be eliminated, thereby promoting reduction in the number of pins of the connector, reduction of the size of the connector, and reduction in cost.

According to embodiments of the present disclosure, a method includes: detecting, by a motor controller, an interlock failure of a connector for connecting between a gate driver and the motor controller, the connector being connected to an inverter for driving a motor in an eco-friendly vehicle; and determining, by the motor controller, that the interlock failure of the connector has occurred when an output value of a signal processor provided in the motor controller so that a sensing signal is inputted from the gate driver through the connector is detected as a value beyond a predetermined normal sensing range.

The signal processor may include a pull-up resistor connected to the power input terminal, and the signal processor may output a voltage divided by the pull-up resistor when a voltage signal is inputted as the sensing signal through the connector.

The sensing signal may be a temperature sensing signal outputted from a temperature sensor installed in a power module in the inverter or the gate driver in order to monitor a junction temperature of the power module in the inverter.

The method may further include determining, by the motor controller, that the interlock failure of the connector has occurred when an output value corresponding to a power voltage is detected from the signal processor.

The method may further include determining, by the motor controller, that the connector has been normally interlocked when an output value within the predetermined normal sensing range is detected from the signal processor.

Furthermore, according to embodiments of the present disclosure, a non-transitory computer readable medium containing program instructions for performing a method include: program instructions that detect an interlock failure of a connector for connecting between a gate driver and a motor controller, the connector being connected to an inverter for driving a motor in an eco-friendly vehicle; and program instructions that determine that the interlock failure of the connector has occurred when an output value of a signal processor provided in the motor controller so that a sensing signal is inputted from the gate driver through the connector is detected as a value beyond a predetermined normal sensing range.

The signal processor may include a pull-up resistor connected to the power input terminal, and the signal processor may output a voltage divided by the pull-up resistor when a voltage signal is inputted as the sensing signal through the connector.

The sensing signal may be a temperature sensing signal outputted from a temperature sensor installed in a power module in the inverter or the gate driver in order to monitor a junction temperature of the power module in the inverter.

The non-transitory computer readable medium may further include determining, by the motor controller, that the interlock failure of the connector has occurred when an output value corresponding to a power voltage is detected from the signal processor.

The non-transitory computer readable medium may further include determining, by the motor controller, that the connector has been normally interlocked when an output value within the predetermined normal sensing range is detected from the signal processor.

Accordingly, interlock and an interlock failure of the connector are identified using the existing input signal inputted to the motor controller from the gate driver for driving the inverter, so that the existing interlock circuit can be eliminated, thereby achieving reduction in the number of pins of the connector, reduction of the size of the connector, and reduction in cost.

The above and other features of the disclosure are discussed infra.

BRIEF DESCRIPTION OF THE DRAWINGS

The above and other features of the present disclosure will now be described in detail with reference to certain embodiments thereof illustrated the accompanying drawings which are given hereinbelow by way of illustration only, and thus are not imitative of the present disclosure, and wherein:

FIG. 5 is a diagram illustrating a temperature table.

Figure 1:
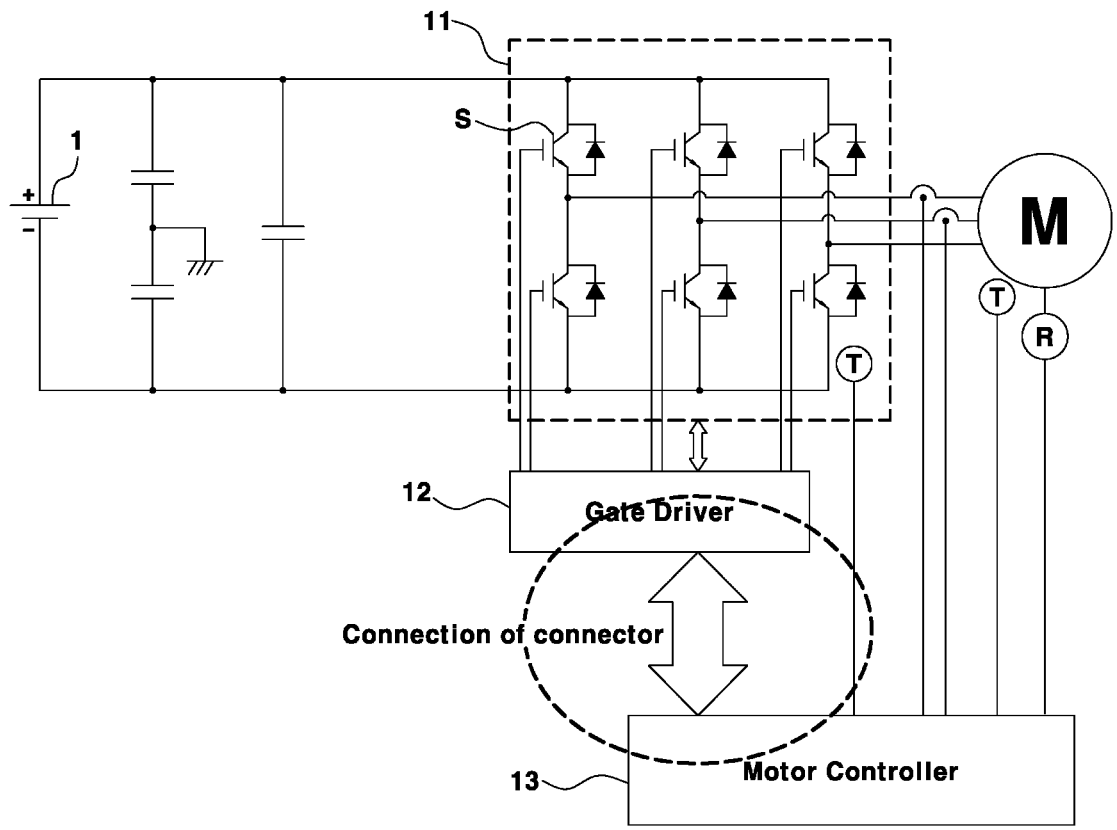
FIG. 1 is a configuration diagram illustrating a power system of an eco-friendly vehicle, including a high-voltage power source, a motor, an inverter, a gate driver and a motor controller.
Figure 2:
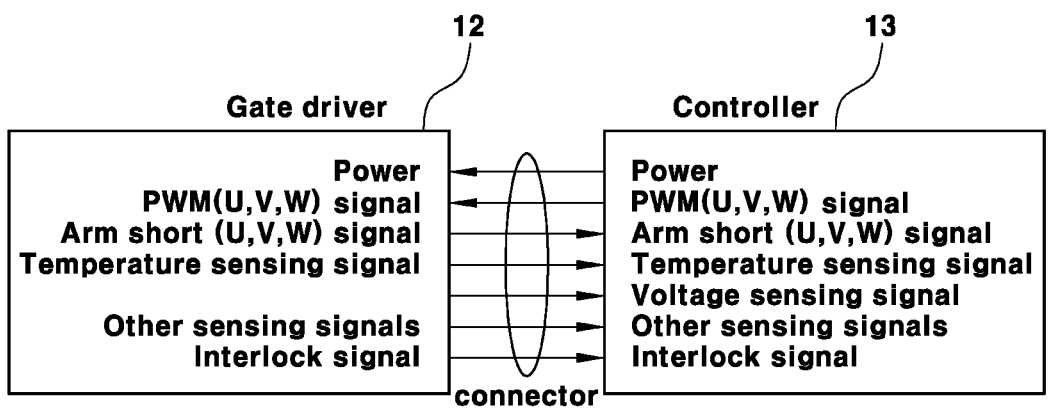
FIG. 2 is a diagram illustrating a connection between the gate driver and the motor controller.
Figure 3:
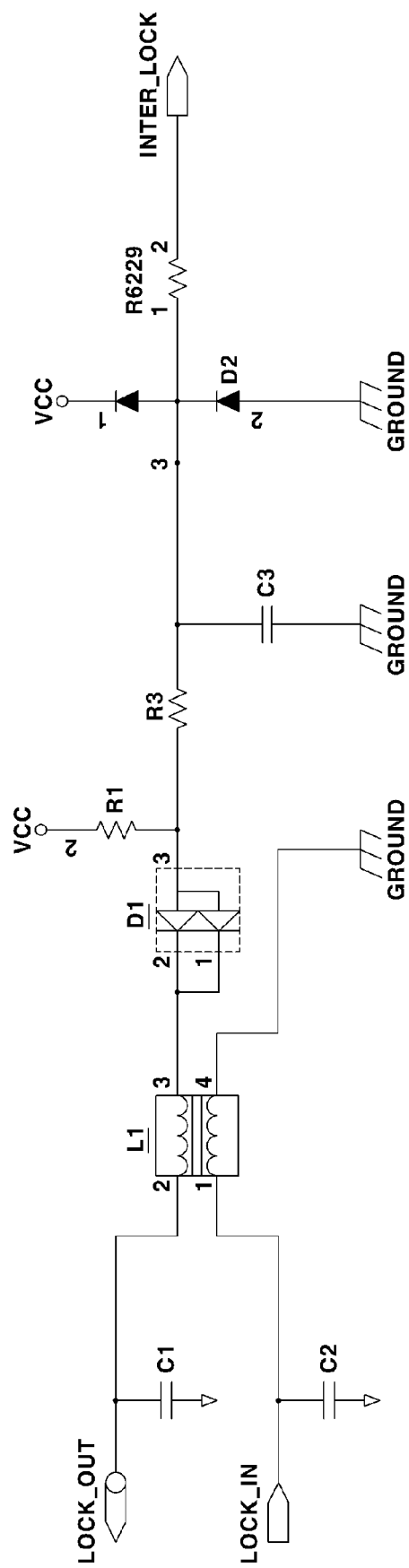
FIG. 3 is a circuit diagram illustrating an example of an interlock circuit according to a conventional art.

It should be understood that the appended drawings are not necessarily to scale, presenting a somewhat simplified representation of various preferred features illustrative of the basic principles of the disclosure. The specific design features of the present disclosure as disclosed herein, including, for example, specific dimensions, orientations, locations, and shapes will be determined in part by the particular intended application and use environment. In the figures, reference numbers refer to the same or equivalent parts of the present disclosure throughout the several figures of the drawing.

DETAILED DESCRIPTION OF THE EMBODIMENTS

Hereinafter reference will now be made in detail to various embodiments of the present disclosure, examples of which are illustrated in the accompanying drawings and described below. While the disclosure will be described in conjunction with embodiments, it will be understood that present description is not intended to limit the disclosure to those embodiments. On the contrary, the disclosure is intended to cover not only the embodiments, but also various alternatives, modifications, equivalents and other embodiments, which may be included within the spirit and scope of the disclosure as defined by the appended claims.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g., fuels derived from resources other than petroleum). As referred to herein, a hybrid vehicle is a vehicle that has two or more sources of power, for example both gasoline-powered and electric-powered vehicles.

Additionally, it is understood that one or more of the below methods, or aspects thereof, may be executed by at least one controller. The term "controller" may refer to a hardware device that includes a memory and a processor.

The memory is configured to store program instructions, and the processor is specifically programmed to execute the program instructions to perform one or more processes which are described further below. Moreover, it is understood that the below methods may be executed by an apparatus comprising the controller in conjunction with one or more other components, as would be appreciated by a person of ordinary skill in the art.

Furthermore, the controller of the present disclosure may be embodied as non-transitory computer readable media on a computer readable medium containing executable program instructions executed by a processor, controller or the like. Examples of the computer readable mediums include, but are not limited to, ROM, RAM, compact disc (CD)-ROMs, magnetic tapes, floppy disks, flash drives, smart cards and optical data storage devices. The computer readable recording medium can also be distributed in network coupled computer systems so that the computer readable media is stored and executed in a distributed fashion, e.g., by a telematics server or a Controller Area Network (CAN).

Referring now to the disclosed embodiments, the present disclosure provides a method for detecting an interlock failure of a connector in an eco-friendly vehicle, in which an interlock failure of the connector between a gate driver and a motor controller, connected to an inverter for driving a motor, can be detected in an eco-friendly vehicle such as an electric vehicle, a hybrid electric vehicle or a fuel cell electric vehicle. Particularly, the present disclosure provides a method for detecting an interlock failure of a connector, in which interlock and an interlock failure of the connector are identified using the existing input signal inputted to a motor controller from a gate driver for driving an inverter, so that the existing interlock circuit can be eliminated, thereby promoting reduction in the number of pins of the connector, reduction of the size of the connector, and reduction in cost. Further, the present disclosure has an object to distinguish an actual trouble and a trouble such as an interlock failure of the connector without implementing a separate interlock circuit between the gate driver and the motor controller, thereby preventing damage of a power module in the inverter.

Figure 4:
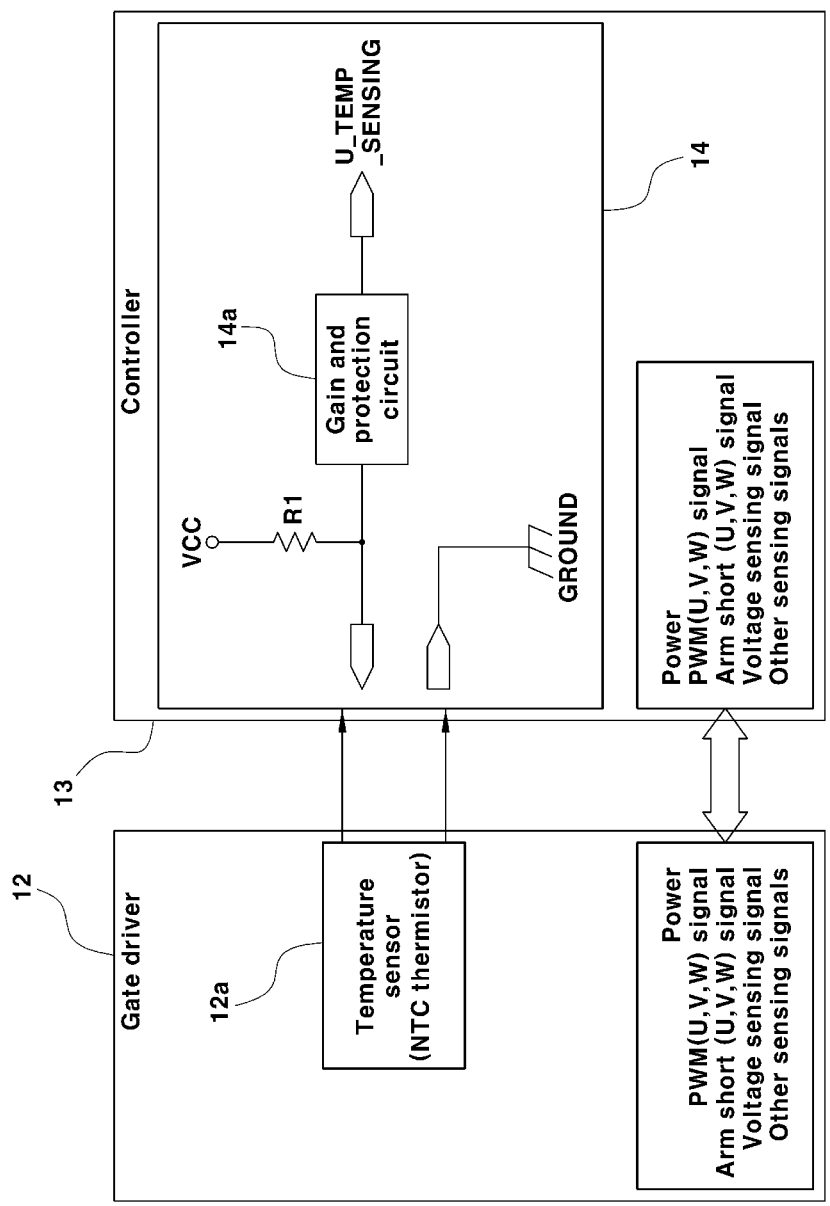
FIG. 4 is a block diagram illustrating a configuration for detecting an interlock failure of a connector according to embodiments of the present disclosure.

FIG. 4 is a block diagram illustrating a configuration for detecting an interlock failure of a connector according to embodiments of the present disclosure.

In the present disclosure, the existing input signal inputted from a gate driver to a motor controller through a connector in order to detect interlock and an interlock failure of the connector, particularly to detect interlock (i.e., disconnection) of the connector. As shown in FIG. 4, a motor controller 13 receives a temperature sensing signal inputted from a gate driver 12 through a connector, and a temperature sensor 12a is installed in the gate driver 12 to monitor a junction temperature of a power module in an inverter. A negative temperature coefficient (NTC) thermistor where electrical resistance is continuously changed depending on temperature is widely used as the temperature sensor 12a.

Since damage of a switching element, the power module or the inverter may occur due to the generation of heater, caused in driving of the inverter, i.e., in operation of the switching element, the motor controller 13 always monitors the temperature of the inverter through the temperature sensing signal transmitted from the gate driver 12. As such, the temperature sensing signal outputted from the temperature sensor (NTC thermistor) 12a in the gate driver 12 is transmitted to the motor controller 13 through the connector. If the connector is of an interlock failure (i.e., open), the temperature sensing signal from the gate driver 12 cannot be transmitted to the motor controller 13.

Accordingly, in the present disclosure, the motor controller 13 is configured to detect interlock and an interlock failure of the connector is detected based on the temperature sensing signal inputted from the gate driver 12. The temperature sensing signal outputted from the temperature sensor (NTC thermistor) is an analog signal, i.e., a voltage signal, corresponding to temperature. In a state in which the connector is normally interlocked, the voltage signal corresponding to the temperature is applied from the gate driver 12 to a signal processor 14.

The temperature sensor (NTC thermistor) may be installed in the power module in the inverter. In this case, the temperature sensing signal outputted from the temperature sensor is inputted to the gate driver 12 and then transmitted to the motor controller 13 through the connector. When the temperature sensor is installed in the power module, the motor controller 13 identifies whether the temperature sensing signal is inputted from the gate driver 12, thereby detecting interlock and an interlock failure of the connector.

In addition, in a state in which the gate driver 12 and the motor controller 13 are normally connected, the motor controller 13 applies power and a pulse width modulation (PWM) signal to the gate driver 12, and receives, from the gate driver 12, an arm short signal (e.g., trouble information signal), a voltage sensing signal, and other various sensing signals. The arm short signal is a trouble information signal, and is used as a signal for detecting a trouble. The conventional interlock circuit for detecting an interlock failure of the connector is eliminated. The temperature sensing signal, the power, the PWM signal, the arm short signal that is trouble information signal, the voltage sensing signal, and the other various sensing signals are transmitted through one connector connecting between the gate driver 12 and the motor controller 13.

Hereinafter, the process of detecting interlock and an interlock failure of the connector between the gate driver and the motor controller using a temperature sensing monitoring value through the signal processor 14 of the motor controller 13 will be described in detail as follows.

The motor controller 13 receives a temperature sensing signal outputted from the temperature sensor 12a, which was inputted from the gate driver 12 through the connector, to monitor the received temperature sensing signal. In this state, the temperature sensing signal (i.e., voltage signal) inputted to the motor controller 13 is voltage-divided by a pull-up resistor R11 connected to a power input terminal VCC in the signal processor 14, to be inputted to a gain and protection circuit 14a. That is, a power voltage, i.e., a VCC voltage (e.g., 5V) is applied through the power input terminal VCC and the pull-up resistor R11. In this state, if the temperature sensing signal, i.e., the temperature sensing voltage, is applied to the signal processor 14 of the motor controller 13 through the connector, the voltage voltage-divided by the pull-up resistor R11 is outputted from the signal processor 14 through the gain and protection circuit 14a. Accordingly, the motor controller 13 reads the voltage passing through the gain and protection circuit 14a, thereby obtaining a temperature according to a temperature table illustrated in FIG. 5.

The normal temperature monitoring value in the state in which the connector is normally interlocked, i.e., the sensing voltage outputted from the signal processor 14, is represented by the following equation: Temperature sensing voltage in normal interlock state of connector={(resistance value of temperature sensor×VCC voltage)/(resistance value of temperature sensor+pull-up resistance)}×gain value.

In the present disclosure, interlock (i.e., disconnection) of the connector is detected based on the temperature sensing monitoring value outputted from the signal processor 14. In this state, if a value beyond the normal monitoring range, i.e., the VCC voltage (i.e., power voltage) applied from the signal processor 14 through the pull-up resistor R11, is read, it is determined that an interlock (i.e., disconnection) failure has occurred. If a VCC voltage is detected through an output terminal of the signal processor 14 when interlock and an interlock failure of the connector are detected based on the temperature sensing signal as described above, the motor controller 13 determines that the interlock failure (i.e., open state, such as disconnection) of the connector has occurred. If a normal temperature sensing monitoring value is detected, the motor controller 13 determines that the connector has been normally interlocked.

Although the use of the temperature sensing signal is illustrated in the embodiments described above, the present disclosure is not limited thereto, and the voltage sensing signal may be used as well as the temperature sensing signal. In addition, another sensing signal input from the driver circuit 12 to the motor controller 13 through the connector may be used, and the interlock and the interlock failure of the connector may be determined using the same signal processor and the same detection manner. That is, if a signal within the normal sensing range is outputted through the signal processor to be detected in the motor controller 13 in a state in which a sensing signal is inputted from the gate driver 12 through the connector, it can be determined that the connector has been normally interlocked. If a signal beyond the normal sensing range is detected, it can be determined that an interlock failure of the connector has occurred. When the pull-down resistor, instead of the pull-up resistor, is applied in the signal processor, the interlock failure of the connector can also be detected.

The disclosure has been described in detail with reference to embodiments thereof. However, it will be appreciated by those skilled in the art that changes may be made in these embodiments without departing from the principles and spirit of the disclosure, the scope of which is defined in the appended claims and their equivalents.

What is claimed is:

1. A method for testing an interlock connection of a connector that directly connects a gate driver and a motor controller including a signal processor, the gate driver being connected to an inverter for driving a motor in an eco-friendly vehicle, the gate driver being configured separately from the motor controller, the motor controller being configured to apply power and a pulse width modulation (PWM) signal to the gate driver, and receive an arm short signal, a temperature sensing signal which is a resistance value of a temperature sensor, a voltage sensing signal, and an interlock signal which are input through the connector from the gate driver, the method comprising:
   determining, by the motor controller, that an interlock failure of the connector has occurred when an output value of the signal processor provided in the motor controller is detected as a value beyond a predetermined normal sensing range or determining, by the motor controller, that the connector is normally interlocked when the output value of the signal processor is detected as a value within the predetermined normal sensing range,
   wherein output value of the signal processor is a temperature sensing voltage, the temperature sensing voltage={(the resistance value of the temperature sensor×a VCC voltage of the motor controller)/(the resistance value of the temperature sensor+a pull-up resistance)}×a gain value,
   wherein the pull-up resistance is measured for a pull-up resistor connected to a power input terminal, the resistance value is a resistance of the temperature sensor installed in a power module in the inverter or the gate driver which changes based on temperature, and the gain value is measured from a gain and protection circuit.

2. The method of claim 1, wherein:
   the signal processor includes the pull-up resistor connected to the power input terminal.

3. The method of claim 1, wherein the temperature sensing signal is outputted from the temperature sensor installed in the power module in the inverter or the gate driver in order to monitor a junction temperature of the power module in the inverter.

4. A non-transitory computer readable storage medium storing instructions executed by a processor to perform a program for testing an interlock connection of a connector that directly connects a gate driver and a motor controller including a signal processor, the gate driver being connected to an inverter for driving a motor in an eco-friendly vehicle, the gate driver being configured separately from the motor controller, the motor controller being configured to apply power and a pulse width modulation (PWM) signal to the gate driver, and receive an arm short signal, a temperature sensing signal which is a resistance value of a temperature sensor, a voltage sensing signal, and an interlock signal which are input through the connector from the gate driver, the program comprising:
   program instructions that determine that an interlock failure of the connector has occurred when an output value of the signal processor provided in the motor controller is detected as a value beyond a predetermined normal sensing range or program instructions that determine that the connector is normally interlocked when the output value of the signal processor is detected as a value within the predetermined normal sensing range,
   wherein the output value of the signal processor is a temperature sensing voltage, the temperature sensing voltage={(the resistance value of the temperature sensor×a VCC voltage of the motor controller)/(the resistance value of the temperature sensor+a pull-up resistance)}×a gain value,
   wherein the pull-up resistance is measured for a pull-up resistor connected to a power input terminal, the resistance value is a resistance of the temperature sensor installed in a power module in the inverter or the gate driver which changes based on temperature, and the gain value is measured from a gain and protection circuit.

5. The non-transitory computer readable medium of claim 4, wherein:
   the signal processor includes the pull-up resistor connected to the power input terminal.

6. The non-transitory computer readable medium of claim 4, wherein the temperature sensing signal is outputted from the temperature sensor installed in the power module in the inverter or the gate driver in order to monitor a junction temperature of the power module in the inverter.

* * * * *